US012641964B2

(12) United States Patent
Peng

(10) Patent No.: US 12,641,964 B2
(45) Date of Patent: May 26, 2026

(54) DISPLAY PANEL AND DISPLAY DEVICE WITH INORGANIC LAYER BETWEEN ANODE AND PIXEL CIRCUIT

(71) Applicant: Wuhan China Star Optoelectronics Semiconductor Display Technology Co., Ltd., Wuhan (CN)

(72) Inventor: Feifei Peng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1197 days.

(21) Appl. No.: 17/619,421

(22) PCT Filed: Nov. 25, 2021

(86) PCT No.: PCT/CN2021/133295
§ 371 (c)(1),
(2) Date: May 25, 2023

(87) PCT Pub. No.: WO2023/087359
PCT Pub. Date: May 25, 2023

(65) Prior Publication Data
US 2024/0040857 A1 Feb. 1, 2024

(30) Foreign Application Priority Data
Nov. 18, 2021 (CN) .......................... 202111372278.8

(51) Int. Cl.
H10K 59/124 (2023.01)
H10K 59/131 (2023.01)

(52) U.S. Cl.
CPC ......... H10K 59/124 (2023.02); H10K 59/131 (2023.02)

(58) Field of Classification Search
CPC ........................... H10K 59/124; H10K 59/131
See application file for complete search history.

(56) References Cited

U.S. PATENT DOCUMENTS

2004/0041147 A1    3/2004  Park
2013/0001603 A1*   1/2013  Lim ................. H10K 59/80521
                                                        438/34
(Continued)

FOREIGN PATENT DOCUMENTS

CN          107452773 A    12/2017
CN          109638054 A     4/2019
(Continued)

OTHER PUBLICATIONS

International Search Report in International application No. PCT/CN2021/133295,mailed on Jul. 27, 2022.
(Continued)

*Primary Examiner* — Lex H Malsawma
(74) *Attorney, Agent, or Firm* — PV IP PC; Christopher S. Ruprecht; Wei Te Chung

(57) ABSTRACT

A display panel and a display device are provided. The display panel includes a substrate, a pixel driving circuit layer, an organic layer, a first wiring layer, an anode layer, a light emitting layer, and an inorganic layer, positioned between the pixel driving circuit layer and the anode layer. A ratio of a thickness of the organic layer to a thickness of the inorganic layer is between 5/2 to 60.

20 Claims, 4 Drawing Sheets

(56)                References Cited

U.S. PATENT DOCUMENTS

| 2017/0012094 | A1* | 1/2017 | Lee | H10K 59/131 |
| 2017/0025489 | A1 | 1/2017 | Choi et al. | |
| 2017/0186819 | A1 | 6/2017 | Yun et al. | |
| 2020/0235187 | A1* | 7/2020 | Bae | H10K 59/121 |

FOREIGN PATENT DOCUMENTS

| CN | 110047880 | A | 7/2019 |
| CN | 110459565 | A | 11/2019 |
| CN | 110690226 | A | 1/2020 |
| CN | 111653595 | A | 9/2020 |
| CN | 112736122 | A | 4/2021 |
| CN | 112750846 | A | 5/2021 |
| CN | 113270462 | A | 8/2021 |
| JP | 2006032156 | A | 2/2006 |

OTHER PUBLICATIONS

Written Opinion of the International Search Authority in International application No. PCT/CN2021/133295,mailed on Jul. 27, 2022.
Chinese Office Action issued in corresponding Chinese Patent Application No. 202111372278.8 dated Oct. 18, 2022, pp. 1-8.

* cited by examiner

102a

105

A    A

112

107

112

104

111

101

105

DISPLAY PANEL AND DISPLAY DEVICE WITH INORGANIC LAYER BETWEEN ANODE AND PIXEL CIRCUIT

CROSS-REFERENCE TO RELATED APPLICATION

This application is a national phase application under 35 U.S.C. § 371 of PCT Application No. PCT/CN2021/133295 filed Nov. 25, 2021, which claims priority to Chinese Application No. 202111372278.8 filed Nov. 18, 2021, the contents of which are incorporated herein by reference in their entirety.

FIELD OF THE DISCLOSURE

The present disclosure relates to a display technology, and more particularly, to a display panel and a display device.

BACKGROUND INFORMATION

A display panel usually has multiple organic insulating layers. Especially, in a camera under panel (CUP) technology, the wiring layer is introduced to electrically connect the light emitting layer in the CUP region to the pixel driving circuit at the neighboring region of the CUP region. However, this increases the number of the organic layers covering the wiring layer and thus increases the total thickness of the organic layers. In the manufacturing process of the display panel, the organic material absorbs the moisture in the air or the wet manufacturing process step. And then, in the following manufacturing process or the storage process, the organic layer may release the moisture to the light emitting layer such that the organic light emitting material of the light emitting layer may not work and thus the display effect is ruined.

SUMMARY

One objective of an embodiment of the present disclosure is to provide a display panel and a display device to solve the above-mentioned issue where the organic layer may release the moisture to the light emitting layer such that the organic light emitting material of the light emitting layer may not work.

According to an embodiment of the present disclosure, a display panel is disclosed. The display panel includes a substrate, a pixel driving circuit layer, an organic layer, a first wiring layer, an anode layer, a light emitting layer, and an inorganic layer. The organic layer is positioned at one side of the pixel driving circuit layer, and faces away the substrate. The organic layer includes stacked a first organic sub-layer and a second organic sub-layer. The first wiring layer is positioned between the first organic sub-layer and the second organic sub-layer and electrically connected to the pixel driving circuit layer trough an opening of the first organic sub-layer. The first wiring layer includes a power signal line connected to a first voltage end. An anode layer is positioned at one side of the organic layer facing away the substrate. The anode layer is electrically connected to the first wiring layer through an opening of the second organic sub-layer. The light emitting layer is positioned at one side of the anode layer facing away the substrate. An inorganic layer is positioned between the pixel driving circuit layer and the anode layer. A ratio of a thickness of the organic layer to a thickness of the inorganic layer is between 5/2 to 60.

Optionally, the thickness of the organic layer is greater than or equal to 2 microns and the thickness of the inorganic layer is greater than or equal to 0.1 microns.

Optionally, the inorganic layer comprises a first inorganic sub-layer, positioned between the second organic sub-layer and the anode layer. The display panel further comprises a second wiring layer, positioned between the first inorganic sub-layer and the second organic sub-layer. The second wiring layer is electrically connected to the first wiring layer through the opening of the second organic sub-layer, and the anode layer is electrically connected to the second wiring layer through the opening of the first inorganic sub-layer.

Optionally, the inorganic layer further comprises a second inorganic sub-layer, the second inorganic sub-layer is positioned between the first organic sub-layer and the second organic sub-layer. The display panel further comprises a third wiring layer, positioned between the first inorganic sub-layer and the second organic sub-layer. The second wiring layer is electrically connected to the third wiring layer through the opening of the second organic sub-layer, and the third wiring layer is electrically connected to the first wiring layer through the opening of the second inorganic sub-layer.

Optionally, the inorganic layer further comprises a second inorganic sub-layer, positioned between the first organic sub-layer and the second organic sub-layer. The display panel further comprises a third wiring layer, positioned between the second inorganic sub-layer and the second organic sub-layer. The third wiring layer is electrically connected to the first wiring layer through an opening of the second inorganic sub-layer, and the anode layer is electrically connected to the third wiring layer through the opening of the second organic sub-layer.

Optionally, the light emitting layer comprises a plurality of light emitting pixels; an orthogonal projection of the first wiring layer connected to some of the light emitting pixels on the substrate is a first projection. An orthogonal projection of the second wiring layer connected to some of the light emitting pixels on the substrate is a second projection; and the first projection and the second projection have a gap in-between.

Optionally, the organic layer comprises at least two organic sub-layers and the inorganic layer comprises at least one inorganic sub-layer. A thickness of each of the organic sub-layers is between 0.1 and 0.4 microns and a thickness of the inorganic sub-layer is between 1 and 2 microns.

Optionally, each of the at least one inorganic sub-layer comprises stacked a first layer and a second layer in a direction of the thickness of the display panel, and the first layer and the second layer are manufactured with different materials.

Optionally, the inorganic sub-layer is manufactured with one or a combination of silicon nitride, silicon oxide, and silicon oxynitride.

Optionally, the display panel further comprises a buffer layer, positioned between the substrate and the pixel driving circuit layer.

According to an embodiment of the present disclosure, a display panel is disclosed. The display panel includes a substrate, a pixel driving circuit layer, an organic layer, a first wiring layer, an anode layer, a light emitting layer, and an inorganic layer. The organic layer is positioned at one side of the pixel driving circuit layer, and faces away the substrate. The organic layer includes stacked a first organic sub-layer and a second organic sub-layer. The first wiring layer is positioned between the first organic sub-layer and the second organic sub-layer and electrically connected to the pixel driving circuit layer trough an opening of the first organic sub-layer. An anode layer is positioned at one side of the organic layer facing away the substrate. The anode layer is electrically connected to the first wiring layer through an opening of the second organic sub-layer. The light emitting layer is positioned at one side of the anode layer facing away the substrate. An inorganic layer is positioned between the pixel driving circuit layer and the anode layer. A ratio of a thickness of the organic layer to a thickness of the inorganic layer is between 5/2 to 60.

Optionally, the thickness of the organic layer is greater than or equal to 2 microns and the thickness of the inorganic layer is greater than or equal to 0.1 microns.

Optionally, the inorganic layer comprises a first inorganic sub-layer, positioned between the second organic sub-layer and the anode layer. The display panel further comprises a second wiring layer, positioned between the first inorganic sub-layer and the second organic sub-layer. The second wiring layer is electrically connected to the first wiring layer through the opening of the second organic sub-layer, and the anode layer is electrically connected to the second wiring layer through the opening of the first inorganic sub-layer.

Optionally, the inorganic layer further comprises a second inorganic sub-layer, the second inorganic sub-layer is positioned between the first organic sub-layer and the second organic sub-layer. The display panel further comprises a third wiring layer, positioned between the first inorganic sub-layer and the second organic sub-layer. The second wiring layer is electrically connected to the third wiring layer through the opening of the second organic sub-layer, and the third wiring layer is electrically connected to the first wiring layer through the opening of the second inorganic sub-layer.

Optionally, the inorganic layer further comprises a second inorganic sub-layer, positioned between the first organic sub-layer and the second organic sub-layer. The display panel further comprises a third wiring layer, positioned between the second inorganic sub-layer and the second organic sub-layer. The third wiring layer is electrically connected to the first wiring layer through an opening of the second inorganic sub-layer, and the anode layer is electrically connected to the third wiring layer through the opening of the second organic sub-layer.

Optionally, the light emitting layer comprises a plurality of light emitting pixels; an orthogonal projection of the first wiring layer connected to some of the light emitting pixels on the substrate is a first projection. An orthogonal projection of the second wiring layer connected to some of the light emitting pixels on the substrate is a second projection; and the first projection and the second projection have a gap in-between.

Optionally, the organic layer comprises at least two organic sub-layers and the inorganic layer comprises at least one inorganic sub-layer. A thickness of each of the organic sub-layers is between 0.1 and 0.4 microns and a thickness of the inorganic sub-layer is between 1 and 2 microns.

Optionally, each of the at least one inorganic sub-layer comprises stacked a first layer and a second layer in a direction of the thickness of the display panel, and the first layer and the second layer are manufactured with different materials.

Optionally, the inorganic sub-layer is manufactured with one or a combination of silicon nitride, silicon oxide, and silicon oxynitride.

According to an embodiment of the present disclosure, a display device is disclosed. The display device comprises a display panel and a light sensing unit. The display panel comprises a main display region, a display transparent region, and a transition display region between the main display region and the display transparent region. The light sensing unit is positioned at one side of the display panel and positioned correspondingly to the display transparent region. The display panel also includes a substrate, a pixel driving circuit layer, an organic layer, a first wiring layer, an anode layer, a light emitting layer, and an inorganic layer. The organic layer is positioned at one side of the pixel driving circuit layer, and faces away the substrate. The organic layer includes stacked a first organic sub-layer and a second organic sub-layer. The first wiring layer is positioned between the first organic sub-layer and the second organic sub-layer and electrically connected to the pixel driving circuit layer trough an opening of the first organic sub-layer. An anode layer is positioned at one side of the organic layer facing away the substrate. The anode layer is electrically connected to the first wiring layer through an opening of the second organic sub-layer. The light emitting layer is positioned at one side of the anode layer facing away the substrate. An inorganic layer is positioned between the pixel driving circuit layer and the anode layer. A ratio of a thickness of the organic layer to a thickness of the inorganic layer is between 5/2 to 60.

The present disclosure provides a display panel and a display device. In the display panel and the display device, the organic layer is positioned at a side of the pixel driving circuit layer facing away the substrate. An inorganic layer is positioned between the driving circuit layer and the anode layer. Because the inorganic layer is positioned between the organic layer and the light emitting layer, the inorganic could effectively block the moisture released from the organic layer to the light emitting layer. This could prevent the organic light emitting material in the light emitting layer from being ineffective and the poor display quality due to the ineffective organic light emitting material. Furthermore, the inorganic layer could block the external moisture from entering the organic layer such that the moisture absorbed by the organic layer could be reduced. Therefore, the external moisture could not enter the transistor in the pixel driving circuit layer. In addition, the thickness ratio of the organic layer and the inorganic layer is from 5/2 to 60. This could maintain the evenness of the anode layer even if the inorganic layer is included and raise the display effect.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

REFERENCE CHARACTER

101: Substrate; 102: Pixel driving circuit layer; 1021: active layer; 1022: First gate insulating layer; 1023: First gate; 1024: Second gate insulating layer; 1025: Second gate; 1026: First interlayer insulating layer; 1027: Second interlayer insulating layer; 1028: Source/drain metal layer; 102*a*: First pixel driving circuit; 102*b*: Second pixel driving circuit; 103: First organic layer; 104: Second organic layer; 105: First wiring layer; 106: Anode layer; 107: Light emitting layer; 107*a*: First light emitting layer; 107*b*: Second light emitting layer; 108: Cathode layer; 1081: First cathode; 1082: Second cathode; 109: First inorganic sub-layer; 1091 First layer; 1092: Second layer; 110: Second wiring layer; 111: Second inorganic sub-layer; 112: Third wiring layer; 113: Buffer layer; 114: Pixel definition layer; 100*a*: main display region; 100*b*: Display transparent region; 100*c*: Transition display region.

DETAILED DESCRIPTION

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

Figure 1:
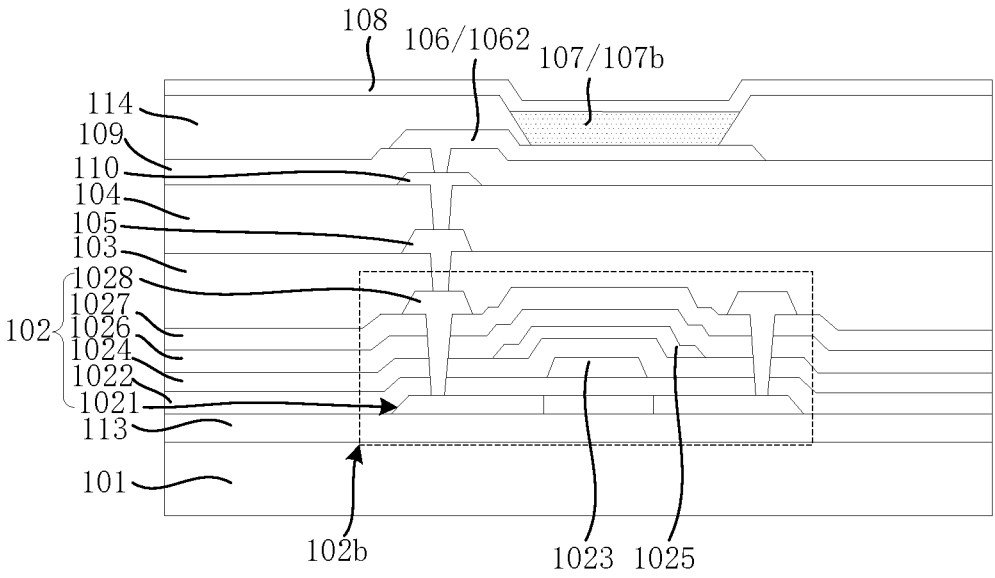
FIG. 1 is a diagram of a cross section of a display panel according to a first embodiment of the present disclosure.

Please refer to FIG. 1. FIG. 1 is a diagram of a cross section of a display panel according to a first embodiment of the present disclosure. The present disclosure discloses a display panel. The display panel comprises a substrate 101, a pixel driving circuit layer 102, an organic layer, a first wiring layer 105, an anode layer 106, a light emitting layer 107 and an inorganic layer.

The pixel driving circuit layer 102 is positioned above the substrate 101. The pixel driving circuit layer 102 comprises a plurality of pixel driving circuits. The organic layer is positioned at a side of the pixel driving circuit layer 102 facing away the substrate 101. The organic layer comprises stacked a first organic sub-layer 103 and a second organic sub-layer 104. The first wiring layer 105 is positioned between the first organic sub-layer 103 and the second organic sub-layer 104 and electrically connected to the pixel driving circuit layer 102 through an opening of the first organic sub-layer 103. The anode layer 106 is positioned at one side of the organic layer facing away the substrate 101. The anode layer 106 is electrically connected to the first wiring layer 105 through an opening of the second organic sub-layer 104. The light emitting layer 107 is positioned at one side of the anode layer 106 facing away the substrate 101. The light emitting layer 107 comprises a plurality of light emitting pixels. The pixel driving circuits are electrically connected to the corresponding light emitting pixels to drive the light emitting pixel to generate light.

The inorganic layer is positioned between the pixel driving circuit layer 102 and the anode layer 106. The thickness ratio of the organic layer to the inorganic layer is between 5/2 to 60.

Because the film layer of the pixel driving circuit layer 102 is thicker, it needs the organic layer having a better fluidity to be its planarization layer. Therefore, the organic layer is positioned at the side of the pixel driving circuit layer 102 facing away the substrate 101 so that the organic layer could planarize the pixel driving circuit layer 102. Furthermore, the organic layer could reduce the difficulty of applied force matching of the film layer to prevent the display panel from cracking or tilting. However, as previously mentioned, the organic layer may easily absorb the moisture in the air or during the wet manufacturing process. The organic layer may release the moisture to the light emitting layer 104 during the usage or storage stage such that the organic light emitting material of the light emitting layer 107 may not work and thus the display effect is ruined.

Because the inorganic material could effectively block the moisture, the inorganic layer is positioned between the pixel driving circuit layer 102 and the anode layer 106 according to an embodiment of the present disclose. That is, the inorganic layer is positioned between the organic layer and the light emitting layer 107. In this way, the inorganic could effectively block the moisture released by the organic layer from reaching the light emitting layer 107 such that the organic light emitting material could be still effective and the display quality is maintained. In addition, the inorganic layer could block the external moisture from entering the organic layer such that the moisture absorbed by the organic layer could be reduced. This could present the external moisture from entering the transistor in the pixel driving circuit layer 102.

Moreover, the thickness ratio of the organic layer to the inorganic layer is set to be between 5/2 to 60. Because the establishment of the inorganic layer influences the evenness of each film layer and the thickness of the organic layer determines the evenness of each film layer, in order not to reduce the evenness of the film layer, the present disclosure controls the thicknesses of the inorganic layer and the organic layer such that a balance between the entire thickness and the evenness of the film layer could be found. In other words, the inorganic layer is not arbitrarily added. Instead, the thickness of the inorganic layer should be matched to the thickness of the organic layer to avoid influencing the evenness of the surface of the anode layer 106 caused by the inorganic layer. This could raise the display effect.

In this embodiment, the thickness of the organic layer is greater than or equal to 2 microns and the thickness of the inorganic layer is greater than or equal to 0.1 microns.

The inorganic layer comprises at least one inorganic sub-layer. Each of the inorganic sub-layers is between 1 to 2 microns to ensure the moisture isolation effect of the inorganic sub-layer. For example, the size of the inorganic sub-layer in the thickness direction could be 1 micron, 1.1 microns, 1.2 microns, 1.3 microns, 1.4 microns, 1.5 microns, 1.6 microns, 1.7 microns, 1.8 microns, 1.9 microns, or 2.0 microns.

The organic layer comprises at least two organic sub-layers. Each of the organic sub-layers has a thickness between 0.1-0.4 microns to ensure the planarization effect of the organic sub-layers. For example, the thickness of the organic sub-layer could be 0.1 microns, 0.2 microns, 0.3 microns, and 0.4 microns.

The material of the inorganic sub-layer comprises one or a combination of silicon nitride, silicon oxide and silicon oxynitride. Optionally, the material of the inorganic could be manufactured with one or a combination of SiOx, SiNx, and SiOxNy. In this embodiment, the inorganic is manufactured with SiNx.

Optionally, the material of the first wiring layer 105 could be the same of the material of the source/drain of the pixel driving circuit layer 102. The first wiring layer 105 and the source/drain form a double-layer source/drain metal layer to reduce the resistance. Specifically, the first wiring layer 105 comprises a power signal line connected to a first voltage end. In addition, the power signal line comprises a low voltage source line to provide a low voltage source.

The material of the first wiring layer 105 could be different from the material of the source/drain of the pixel driving circuit layer 102. In this case, the first wiring layer 105 could comprise a plurality of transparent wires. This could increase the layout space without affecting the transparency.

The number of the inorganic sub-layers should be the same as the number of the wiring layers in addition to the first wiring layer 105. For example, if the display panel further comprises a wiring layer in addition to the first wiring layer 105, then the inorganic layer correspondingly comprise one inorganic sub-layer. If the display panel further comprises two wiring layers in addition to the first wiring layer 105, then the inorganic layer correspondingly comprise two inorganic sub-layers.

If the display panel further comprises N wiring layers in addition to the first wiring layer 105, then the inorganic layer correspondingly comprise N inorganic sub-layers.

In order to clearly illustrate the technique of the present disclosure, the display panel further comprises one or two wiring layers in addition to the first wiring layer 105 and the inorganic layer comprises at least one or two inorganic sub-layers according to an embodiment of the present disclosure.

Please refer to FIG. 1 again. The display panel further comprises a wiring layer in addition to the first wiring layer 105 and the inorganic layer comprises an inorganic layer.

The inorganic layer comprises a first inorganic sub-layer 109, positioned between the second organic sub-layer 104 and the anode layer 106. The display panel further comprises the second wiring layer 110, positioned between the first inorganic sub-layer 109 and the second organic sub-layer 104. The second wiring layer 110 is electrically connected to the first wiring layer through the opening of the second organic sub0layer 104. The anode layer 104 is electrically connected to the second wiring layer 110 through the opening of the first inorganic sub-layer 109.

The first inorganic sub-layer 109 is positioned between the second organic sub-layer 104 and the anode layer 106. The first organic sub-layer 103 is positioned at a side of the second organic sub-layer 104 facing away the first inorganic sub-layer 109. That is, the first inorganic sub-layer 109 is positioned between the second organic sub-layer 104 and the light emitting layer 107. In this way, the first inorganic sub-layer 109 could effectively block the moisture released from the first organic sub-layer 103 and the second organic sub-layer 104 from reaching the light emitting layer 104 such that it could prevent the organic light emitting material in the light emitting layer 104 from being ineffective and thus ensures the display quality. In addition, the first inorganic sub-layer 109 could block the external moisture from entering the first organic sub-layer 103 and the second organic sub-layer 104 such that the first organic sub-layer

103 and the second organic sub-layer 104 absorb less moisture. This could prevent external moisture from entering the pixel driving circuit layer 102 to make the transistor in the pixel driving circuit layer 102 ineffective.

Furthermore, the thickness of the first inorganic sub-layer 109 is matched to the thicknesses of the first organic sub-layer 103 and the second organic sub-layer 104 to prevent the establishment of the first inorganic sub-layer 109 from affecting the evenness of surface of the anode layer 106. This could raise the display quality.

Figure 2:
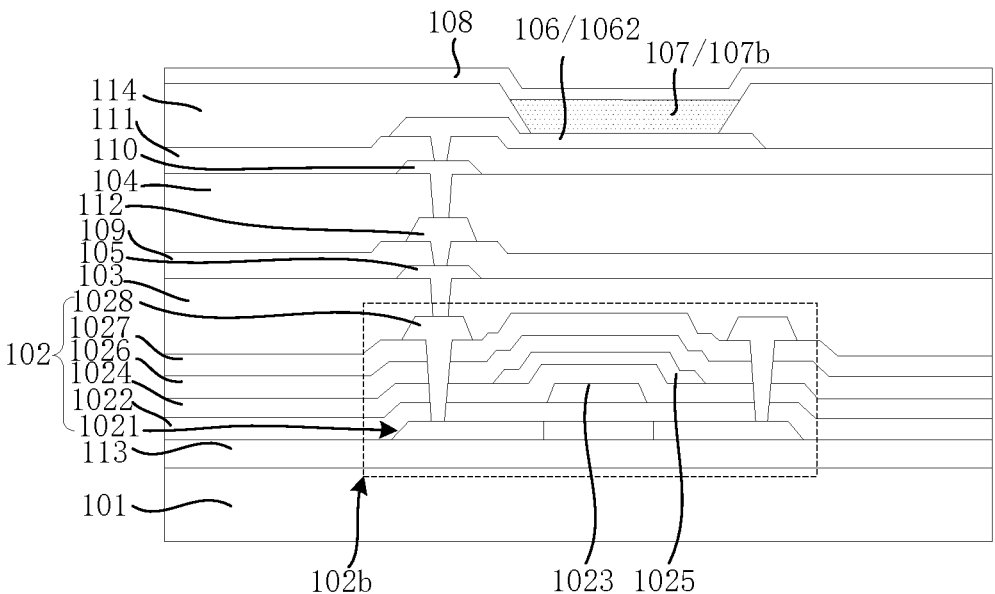
FIG. 2 is a diagram of a cross section of a display panel according to a second embodiment of the present disclosure.

Please refer to FIG. 2. FIG. 2 is a diagram of a cross section of a display panel according to a second embodiment of the present disclosure. The difference between FIG. 2 and FIG. 1 is that the display panel further comprises two wiring layers in addition to the first wiring layer 105 and the inorganic layer comprises two inorganic sub-layers.

In this embodiment, the inorganic layer further comprises a second inorganic sub-layer 111. The display panel further comprises a third wiring layer 112. The second inorganic sub-layer 111 and the third wiring layer 112 are further included based on the structure of the display panel shown in FIG. 1. Here, the second organic sub-layer 111 is positioned between the first organic sub-layer 103 and the second organic sub-layer 104. The third wiring layer 112 is positioned between the first inorganic sub-layer 109 and the second organic sub-layer 104. The second wiring layer 110 is electrically connected to the third wiring layer 112 through the opening of the second organic sub-layer 104. The third wiring layer 112 is electrically connected to the first wiring layer 105 through the opening of the second inorganic layer 111.

The first inorganic sub-layer 109 is positioned between the second organic sub-layer 104 and the first organic sub-layer 103. The second inorganic sub-layer 111 is positioned between the second organic sub-layer 104 and the anode layer 106. In this way, the first inorganic sub-layer 109 could effectively block the moisture released from the first organic sub-layer 103 from reaching the light emitting layer 107. The second inorganic sub-layer 111 could effectively block moisture released from the first organic sub-layer 103 and the second organic sub-layer 104 from reaching the light emitting layer 107. This could prevent the organic light emitting material in the light emitting layer 107 from being ineffective and the poor display quality due to the ineffective organic light emitting material. In addition, the first inorganic sub-layer 109 could block the external moisture from entering the first organic sub-layer 103. The second inorganic sub-layer 111 could block the external moisture from entering the first organic sub-layer 103 and the second organic sub-layer 104. Therefore, the first organic sub-layer 103 and the second organic sub-layer 104 absorb less moisture. This could prevent external moisture from entering the pixel driving circuit layer 102 to make the transistor in the pixel driving circuit layer 102 ineffective.

Figure 3:
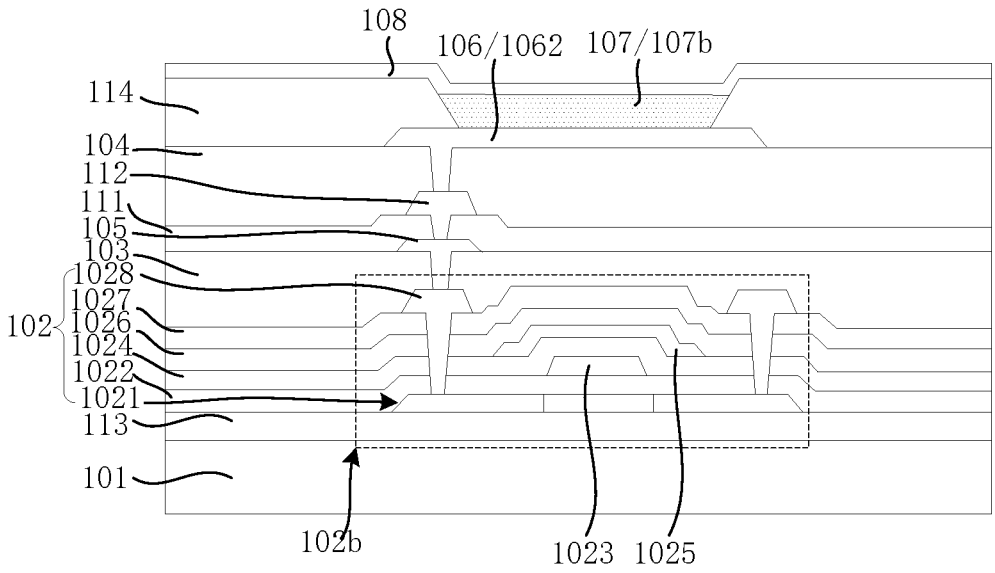
FIG. 3 is a diagram of a cross section of a display panel according to a third embodiment of the present disclosure.

Please refer to FIG. 3. FIG. 3 is a diagram of a cross section of a display panel according to a third embodiment of the present disclosure. The difference between FIG. 3 and FIG. 1 is in the position of the organic sub-layer.

The inorganic layer comprises a second inorganic sub-layer 111. The second inorganic sub-layer 111 is positioned between the first organic sub-layer 103 and the second organic sub-layer 104. The display panel further comprises a third wiring layer 112. The third wiring layer 112 is positioned between the second inorganic sub-layer 111 and the second organic sub-layer 104. The third wiring layer 112 is electrically connected to the first wiring layer 105 through the opening of the second inorganic sub-layer 111. The anode layer 106 is electrically connected to the third wiring layer 112 through the opening of the second organic sub-layer 104.

The second inorganic sub-layer 111 is positioned between the first organic sub-layer 103 and the second organic sub-layer 104. That is, the second inorganic sub-layer 111 is positioned between the second organic sub-layer 104 and the light emitting layer 107. In this way, the second inorganic sub-layer 111 could effectively block moisture released from the first organic sub-layer 103 from reaching the light emitting layer 107. This could prevent the organic light emitting material in the light emitting layer 107 from being ineffective and the poor display quality due to the ineffective organic light emitting material. In addition, the first inorganic sub-layer 109 could block the external moisture from entering the second organic sub-layer 104 such that the second organic sub-layer 104 absorbs less moisture. This could prevent external moisture from entering the pixel driving circuit layer 102 to make the transistor in the pixel driving circuit layer 102 ineffective.

Figure 4:
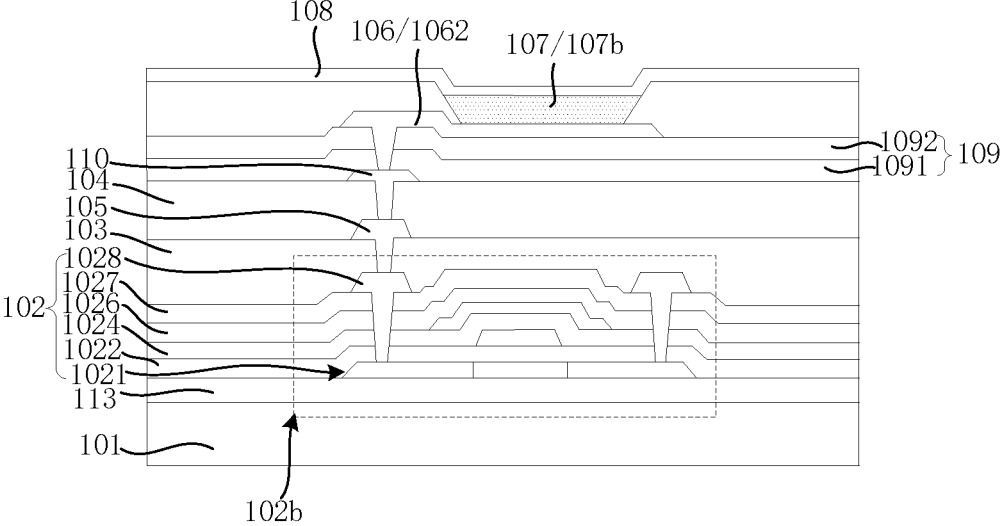
FIG. 4 is a diagram of a cross section of a display panel according to a fourth embodiment of the present disclosure.

Please refer to FIG. 4. FIG. 4 is a diagram of a cross section of a display panel according to a fourth embodiment of the present disclosure. The difference between FIG. 4 and FIG. 1 is that each of the inorganic sub-layers comprises orderly stacked a first layer and a second layer, the first layer and the second layer are manufactured with different materials and each of the inorganic sub-layers have multi-layer structure of inorganic insulating layers to raise the moisture isolation effect.

The first inorganic sub-layer 109 comprises stacked the first layer 1091 and the second layer 1092. The first layer 1092 is positioned at a side of the second layer 1092 facing away the substrate. The anode layer 106 is electrically connected to the wiring layer 105 through the openings of the first layer 1091 and the second layer 1092.

Surely, each of the inorganic sub-layers could further comprise a third layer or a fourth layer to further raise the moisture isolation effect. Similarly, the first inorganic sub-layer 109 and the second inorganic sub-layer 111 in this embodiment could adopt the multi-layer structure of insulating layers. Further illustration is omitted here for simplicity.

Figure 5A:
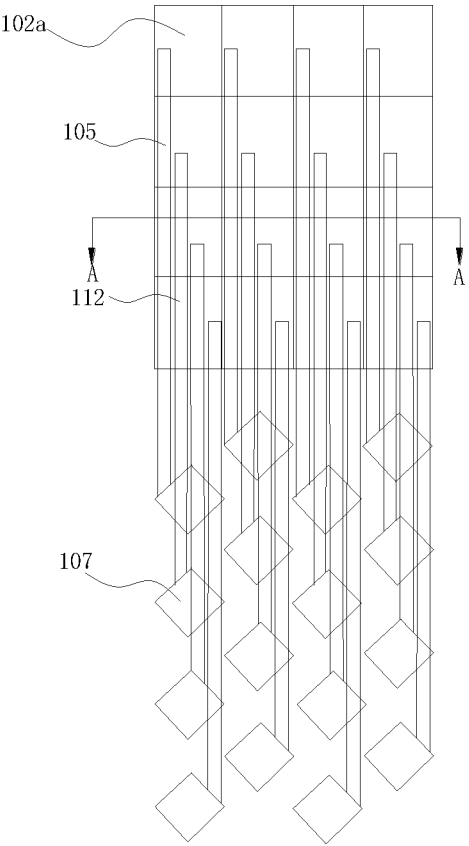
FIG. 5A is a diagram showing the wiring layer in the display panel shown in FIG. 1.
Figure 5B:
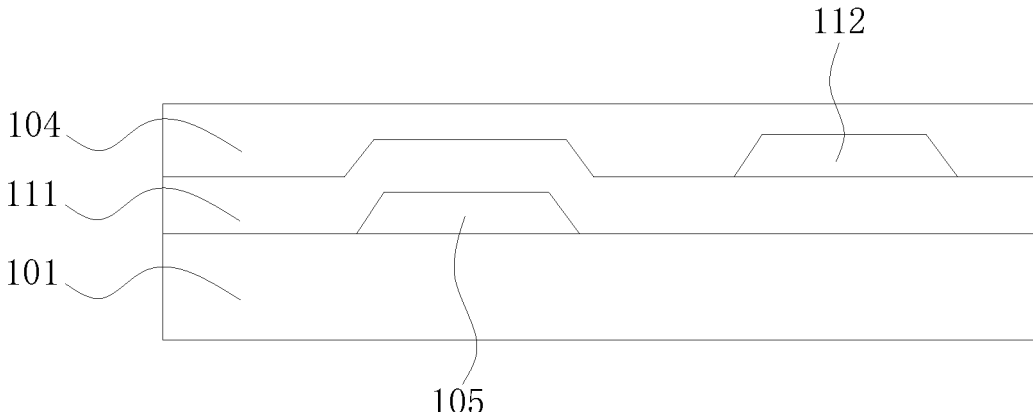
FIG. 5B is a diagram of a cross section of A-A' line shown in FIG. 5A.

Please refer to FIG. 5A and FIG. 5B. FIG. 5A is a diagram showing the wiring layer in the display panel shown in FIG. 1. FIG. 5B is a diagram of a cross section of A-A' line shown in FIG. 5A. Here, a parasite capacitor ($Cp=S\varepsilon/4\pi kd$) between the first wiring layer 105 and the third wiring layer 112 exists. Here, S represents the overlapped area of the first wiring layer 105 and the third wiring layer 112. $\varepsilon$ represents the dielectric constant of the second inorganic sub0layer 111. d represents the thickness of the second inorganic sub-layer 111. k represents the Coulomb's constant. From the above equation, it could be seen that the parasite capacitance Cp between the first wiring layer 105 and the third wiring layer 112 is determined by the overlapped area S of the first wiring layer 105 and the third wiring layer 112 and the thickness d and the dielectric constant c of the dielectric layer (the second inorganic sub-layer 111) between the first wiring layer 105 and the third wiring layer 112. Therefore, the parasite capacitance Cp between the first wiring layer 105 and the third wiring layer 112 could be reduced by adjusting the overlapped area S of the first wiring layer 105 and the third wiring layer 112 and/or the thickness d and the dielectric constant c of the second inorganic sub-layer 111 between the first wiring layer 105 and the third wiring layer 112.

On the condition that the first wiring layer 105 and the third wiring layer 112 have certain parameters, the dielectric constant of the inorganic layer is usually higher than that of the organic layer and the inorganic layer is usually thinner than the organic layer. Therefore, the parasite capacitance between the first wiring layer 105 and the third wiring layer 112 is comparatively greater and has greater impact on the signal. From the above equation, it could be understood that the parasite capacitance could be adjusted to be lower by adjusting the overlapped area S of the first wiring layer 105 and the third wiring layer 112.

In this embodiment, the orthogonal projection of the first wiring layer 105 connected to some of the light emitting pixels on the substrate 101 is a first projection and the orthogonal projection of the third wiring layer 112 connected to some of the light emitting pixels on the substrate is a second projection. The first projection and the second projection have a gap in-between. In other words, in this embodiment, the orthogonal projection of the first wiring layer 105 on the substrate 101 (the first projection) and the orthogonal projection of the third wiring layer 112 on the substrate 101 (the second projection) have no overlapping region to reduce the parasite capacitance Cp between the first wiring layer 105 and the third wiring layer 112.

Please refer to FIG. 1 to FIG. 4. The display panel further comprises a buffer layer 113 positioned between the substrate 101 and the pixel driving circuit layer 102. The buffer layer 113 is configured to protect the pixel driving circuit layer 102 and is often manufactured by an organic insulating material.

In the following disclosure, the film layer structure of the pixel driving circuit layer 102 will be illustrated.

The pixel driving circuit layer 102 comprises a plurality of pixel driving circuits. The pixel driving circuit comprises a plurality of transistors, which include one type of the oxide transistor and the silicon transistor. Here, the transistors comprise field effect transistors. Furthermore, the transistors comprise thin film transistors. It should be noted that the structure of the transistors is not limited to the double-gate structure shown in FIG. 1-FIG. 4. One having ordinary skills in the art could use another structure, such as a single-gate structure, and further illustration is omitted here.

Specifically, the transistor comprises an active layer 1021, a first gate insulating layer 1022, a first gate 1023, a second gate insulating layer 1024, a second gate 1025, a first interlayer insulating layer 1026, a second interlayer insulating layer 1027 and a source/drain metal layer 1028.

The active layer 1021 is positioned at one side of the buffer layer 113 facing away the substrate 101. The first gate insulating layer 1022 covers the active layer 1021. The first gate 1023 is positioned at one side of the first gate insulating layer 1022 facing away the substrate 101. The second gate insulating layer 1024 covers the first gate 1023. The second gate 1025 is positioned at one side of the second gate insulating layer 1024 facing away the substrate 101. The first interlayer insulating layer 1026 covers the second gate 1025. The second interlayer insulating layer 1027 is positioned at one side of the first inter-layer insulating layer 1026 facing away the substrate 101. The source/drain metal layer 1028 is positioned at one side of the second interlayer insulating layer 1027 facing away the substrate 101. The source/drain metal layer 1028 comprises a source and a drain. One of the source and the drain is electrically connected to the first wiring layer 105 such that the light emitting layer 107 is driven by the pixel driving circuit to generate light.

Similarly, because the thickness of the active layer 1021, the first gate 1023, the second gate 1025 and source/drain metal layer 1028 is thicker, there is a huge height difference between the locations in the structure with and without these film layers. Thus, an organic insulating layer having a better fluidity needs to be included as a planarization layer to planarize the above-mentioned film layers. Specifically, the first gate insulating layer 1022, the second gate insulating layer 1024, the first interlayer insulating layer 1026 and the second interlayer insulating layer 1027 are all organic layers such that the second organic sub-layer 104 has a lot of moisture. In this embodiment, the first inorganic sub-layer 109 is included to block the moisture released from the first gate insulating layer 1022, the second gate insulating layer 1024, the first interlayer insulating layer 1026, the second interlayer insulating layer 1027 and the first organic sub-layer 103 from entering the light emitting layer 107. This prevents the organic light emitting material in the light emitting layer 107 from being ineffective. In addition, the first inorganic sub-layer 109 could block the external moisture from entering first gate insulating layer 1022, the second gate insulating layer 1024, the first interlayer insulating layer 1026, the second interlayer insulating layer 1027 and the first organic sub-layer 103 such that the external moisture cannot enter the transistor in the pixel driving circuit layer 102.

The display panel further comprises a pixel definition layer 113. The light emitting layer 107 is in the pixel definition region of the pixel definition layer 114.

The display panel could further comprise a touch electrode, a package layer and a color film layer (not shown).

Figures 6, 7:
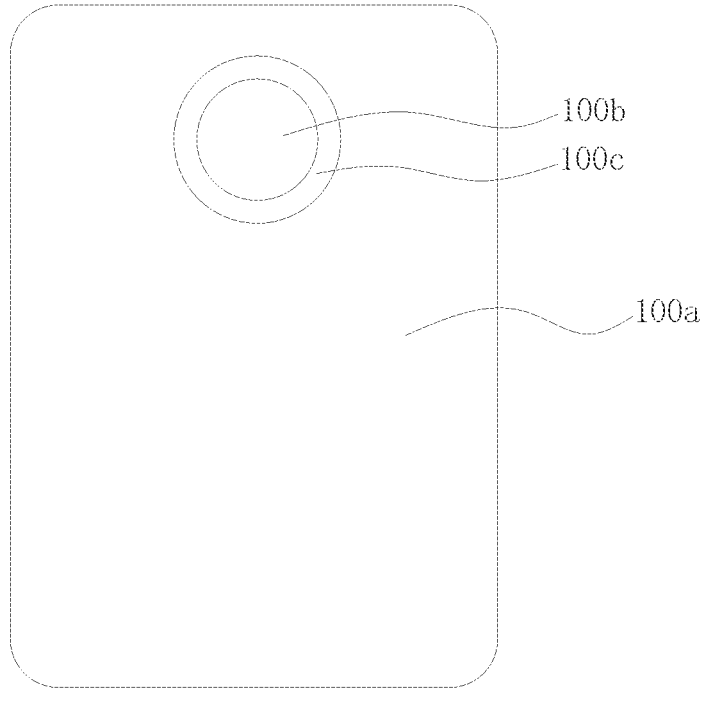
FIG. 6 is a top view of a display panel according to an embodiment of the present disclosure.
FIG. 7 is a diagram of a part of the display panel shown in FIG. 1.

Please refer to FIG. 6 and FIG. 7. FIG. 6 is a top view of a display panel according to an embodiment of the present disclosure. FIG. 7 is a diagram of a part of the display panel shown in FIG. 1. The display panel could adopt the CUP design. The display panel comprises a main display region 100a, a display transparent region 100b and a transition display region 100c between the main display region 100a and the display transparent region 100b.

Please refer to FIG. 1 in conjunction with FIG. 7. The first wiring layer 105 and the second wiring layer 110 comprises a plurality of transparent wires. The transparent wires extend from the transition display region 100c to the display transparent region 100b. The pixel driving circuit comprises a first pixel driving circuit 102a in the transition display region 100c. The light emitting layer comprises a first light emitting layer 107a in the display transparent region 100b. The first pixel driving circuit 102b is electrically connected to the first light emitting layer 107a through the transparent wires to drive the first light emitting layer 107a to generate light such that the light sensing units located at one side of the display panel corresponding to the display transparent region 100b could receive light signals while the display transparent region 100b is displaying images.

The display panel further comprises a first anode 1061 and a cathode layer 108. The cathode layer 108 comprises a first cathode 1081. The first anode 1061 is positioned at one side of the first inorganic sub-layer 109 facing away the substrate 101. The first cathode 1081 is positioned at one side of the first anode 1061 facing away the substrate 101. The first light emitting layer 107a is positioned between the first anode 1061 and the first cathode 1081.

The material of the first anode 1061 comprises a transparent conducting thin film. Specifically, the material of the first anode 1061 comprises one of the ITO and InSnZnO or a combination of ITO, InSnZnO and silver. The first light emitting layer 107a further comprises one of a quantum dot material, a perovskite material and a fluorescent material.

The display panel comprises a second light emitting layer 107b and a third light emitting layer. The second light emitting layer 107b is positioned in the transition display region 100c. The third light emitting layer is positioned in the main region 100a. The second light emitting layer 107b is driven by the first pixel driving circuit 102a to generate light. The pixel driving circuit layer 102 further comprises a plurality of second pixel driving circuits 102b. The second pixel driving circuits 102b are positioned in the main display region 100a to drive the third light emitting layer to generate light.

The display panel further comprises a second anode 1062 and a second cathode 1081. The second anode 1062 is positioned at one side of the first inorganic sub-layer 109 facing away the substrate 101. The second cathode 1081 is positioned at one side of the second anode 1062 facing away the substrate 101. The second light emitting layer 107b is positioned between the second anode 1062 and the second cathode 1082. The display panel further comprises a third anode and a third cathode. The third anode is positioned at one side of the first inorganic sub-layer 109 facing away the substrate 101. The third cathode is positioned at one side of the third anode facing away the substrate 101. The third light emitting layer is positioned between the third anode and the third cathode.

The display panel could comprise a plurality of the display transparent regions 100b. The positions of the display transparent regions 100b could be placed according to the actual demands and further illustration is omitted.

According to an embodiment of the present disclosure, a display device is disclosed. The display device comprises the above-mentioned display panel. The display panel comprises a light sensing unit if the display panel adopts the CUP design. The display panel comprises a main display region 100a, a display transparent region 100b and a transition display region 100c between the main display region 100a and the display transparent region 100b. The light sensing unit is positioned at one side of the display panel correspondingly to the display transparent region 100b such that the display device could achieve the fingerprint identification, camera, light sensing, and distance sensing functions.

The light sensing unit comprises a fingerprint identification sensor, a camera, a structured light sensor, a flying time sensor, a distance sensor, and/or a light sensor such that the sensor could collect the signals through the display transparent region to realize sensing under panel functions, including fingerprint identification under panel, camera under panel, face identification under panel and distance sensing under panel.

The display device comprises a fixed terminal, such as a television or a desktop computer, a mobile terminal, such as a cell phone or a laptop, and a wearable equipment, such as a wristband, virtual reality equipment, or an augmented reality equipment.

In conclusion, the present disclosure provides a display panel and a display device. In the display panel and the display device, the organic layer is positioned at a side of the pixel driving circuit layer facing away the substrate. An inorganic layer is positioned between the driving circuit layer and the anode layer. Because the inorganic layer is positioned between the organic layer and the light emitting layer, the inorganic could effectively block the moisture released from the organic layer to the light emitting layer. This could prevent the organic light emitting material in the light emitting layer from being ineffective and the poor display quality due to the ineffective organic light emitting material. Furthermore, the inorganic layer could block the external moisture from entering the organic layer such that the moisture absorbed by the organic layer could be reduced.

Therefore, the external moisture could not enter the transistor in the pixel driving circuit layer. In addition, the thickness ratio of the organic layer and the inorganic layer is from 5/2 to 60. This could maintain the evenness of the anode layer even if the inorganic layer is included and raise the display effect.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, comprising:
a substrate;
a pixel driving circuit layer, positioned above the substrate;
an organic layer, positioned at one side of the pixel driving circuit layer, facing away the substrate, the organic layer comprising stacked a first organic sub-layer and a second organic sub-layer;
a first wiring layer, positioned between the first organic sub-layer and the second organic sub-layer and electrically connected to the pixel driving circuit layer through an opening of the first organic sub-layer, the first wiring layer comprising a power signal line connected to a first voltage end;
an anode layer, positioned at one side of the organic layer facing away the substrate, the anode layer electrically connected to the first wiring layer through an opening of the second organic sub-layer;
a light emitting layer, positioned at one side of the anode layer facing away the substrate; and
an inorganic layer, positioned between the pixel driving circuit layer and the anode layer, wherein a ratio of a thickness of the organic layer to a thickness of the inorganic layer is between 5/2 to 60;
wherein the inorganic layer is provided with an opening at a position corresponding to the opening of the second organic sub-layer, and in a direction of the thickness of the display panel, the thickness of the inorganic layer at a position of the opening of the inorganic layer is greater than the thickness of the inorganic layer without the opening.

2. The display panel of claim 1, wherein the thickness of the organic layer is greater than or equal to 2 microns and the thickness of the inorganic layer is greater than or equal to 0.1 microns.

3. The display panel of claim 1, wherein the inorganic layer comprises a first inorganic sub-layer, positioned between the second organic sub-layer and the anode layer;
wherein the display panel further comprises a second wiring layer, positioned between the first inorganic sub-layer and the second organic sub-layer, the second wiring layer is electrically connected to the first wiring layer through the opening of the second organic sub-layer, and the anode layer is electrically connected to the second wiring layer through an opening of the first inorganic sub-layer.

4. The display panel of claim 3, wherein the inorganic layer further comprises a second inorganic sub-layer, the second inorganic sub-layer is positioned between the first organic sub-layer and the second organic sub-layer;
wherein the display panel further comprises a third wiring layer, positioned between the first inorganic sub-layer and the second organic sub-layer; the second wiring layer is electrically connected to the third wiring layer through the opening of the second organic sub-layer, and the third wiring layer is electrically connected to the first wiring layer through an opening of the second inorganic sub-layer.

5. The display panel of claim 4, wherein the light emitting layer comprises a plurality of light emitting pixels; an orthogonal projection of the first wiring layer connected to some of the light emitting pixels on the substrate is a first projection; an orthogonal projection of the second wiring layer connected to some of the light emitting pixels on the substrate is a second projection; and the first projection and the second projection have a gap in-between.

6. The display panel of claim 1, wherein the inorganic layer further comprises a second inorganic sub-layer, positioned between the first organic sub-layer and the second organic sub-layer;
wherein the display panel further comprises a third wiring layer, positioned between the second inorganic sub-layer and the second organic sub-layer, the third wiring layer is electrically connected to the first wiring layer through an opening of the second inorganic sub-layer, and the anode layer is electrically connected to the third wiring layer through the opening of the second organic sub-layer.

7. The display panel of claim 1, wherein the organic layer comprises at least two organic sub-layers and the inorganic layer comprises at least one inorganic sub-layer;
wherein a thickness of each of the organic sub-layers is between 0.1 and 0.4 microns and a thickness of the inorganic sub-layer is between 1 and 2 microns.

8. The display panel of claim 7, wherein each of the at least one inorganic sub-layer comprises stacked a first layer and a second layer in the direction of the thickness of the display panel, and the first layer and the second layer are manufactured with different materials.

9. The display panel of claim 8, wherein the inorganic sub-layer is manufactured with one or a combination of silicon nitride, silicon oxide, and silicon oxynitride.

10. The display panel of claim 1, further comprising:
a buffer layer, positioned between the substrate and the pixel driving circuit layer.

11. A display panel, comprising:
a substrate;
a pixel driving circuit layer, positioned above the substrate;
an organic layer, positioned at one side of the pixel driving circuit layer, facing away the substrate, the organic layer comprising stacked a first organic sub-layer and a second organic sub-layer;
a first wiring layer, positioned between the first organic sub-layer and the second organic sub-layer and electrically connected to the pixel driving circuit layer through an opening of the first organic sub-layer;
an anode layer, positioned at one side of the organic layer facing away the substrate, the anode layer electrically connected to the first wiring layer through an opening of the second organic sub-layer;
a light emitting layer, positioned at one side of the anode layer facing away the substrate; and
an inorganic layer, positioned between the pixel driving circuit layer and the anode layer, wherein a ratio of a thickness of the organic layer to a thickness of the inorganic layer is between 5/2 to 60;
wherein the inorganic layer is provided with an opening at a position corresponding to the opening of the second organic sub-layer, and in a direction of the thickness of the display panel, the thickness of the inorganic layer at a position of the opening of the inorganic layer is greater than the thickness of the inorganic layer without the opening.

12. The display panel of claim 11, wherein the thickness of the organic layer is greater than or equal to 2 microns and the thickness of the inorganic layer is greater than or equal to 0.1 microns.

13. The display panel of claim 11, wherein the inorganic layer comprises a first inorganic sub-layer, positioned between the second organic sub-layer and the anode layer; wherein the display panel further comprises a second wiring layer, positioned between the first inorganic sub-layer and the second organic sub-layer, the second wiring layer is electrically connected to the first wiring layer through the opening of the second organic sub-layer, and the anode layer is electrically connected to the second wiring layer through an opening of the first inorganic sub-layer.

14. The display panel of claim 13, wherein the inorganic layer further comprises a second inorganic sub-layer, the second inorganic sub-layer is positioned between the first organic sub-layer and the second organic sub-layer; wherein the display panel further comprises a third wiring layer, positioned between the first inorganic sub-layer and the second organic sub-layer; the second wiring layer is electrically connected to the third wiring layer through the opening of the second organic sub-layer, and the third wiring layer is electrically connected to the first wiring layer through an opening of the second inorganic sub-layer.

15. The display panel of claim 14, wherein the light emitting layer comprises a plurality of light emitting pixels; an orthogonal projection of the first wiring layer connected to some of the light emitting pixels on the substrate is a first projection; an orthogonal projection of the second wiring layer connected to some of the light emitting pixels on the substrate is a second projection; and the first projection and the second projection have a gap in-between.

16. The display panel of claim 11, wherein the inorganic layer further comprises a second inorganic sub-layer, positioned between the first organic sub-layer and the second organic sub-layer; wherein the display panel further comprises a third wiring layer, positioned between the second inorganic sub-layer and the second organic sub-layer, the third wiring layer is electrically connected to the first wiring layer through an opening of the second inorganic sub-layer, and the anode layer is electrically connected to the third wiring layer through the opening of the second organic sub-layer.

17. The display panel of claim 11, wherein the organic layer comprises at least two organic sub-layers and the inorganic layer comprises at least one inorganic sub-layer;

wherein a thickness of each of the organic sub-layers is between 0.1 and 0.4 microns and a thickness of the inorganic sub-layer is between 1 and 2 microns.

18. The display panel of claim 17, wherein each of the at least one inorganic sub-layer comprises stacked a first layer and a second layer in the direction of the thickness of the display panel, and the first layer and the second layer are manufactured with different materials.

19. The display panel of claim 18, wherein the inorganic sub-layer is manufactured with one or a combination of silicon nitride, silicon oxide, and silicon oxynitride.

20. A display panel, comprising:
a display panel, comprising:
a main display region;
a display transparent region; and
a transition display region between the main display region and the display transparent region;
a substrate;
a pixel driving circuit layer, positioned above the substrate;
an organic layer, positioned at one side of the pixel driving circuit layer, facing away the substrate, the organic layer comprising stacked a first organic sub-layer and a second organic sub-layer;
a first wiring layer, positioned between the first organic sub-layer and the second organic sub-layer and electrically connected to the pixel driving circuit layer through an opening of the first organic sub-layer, the first wiring layer comprising a power signal line connected to a first voltage end;
an anode layer, positioned at one side of the organic layer facing away the substrate, the anode layer electrically connected to the first wiring layer through an opening of the second organic sub-layer;
a light emitting layer, positioned at one side of the anode layer facing away the substrate; and
an inorganic layer, positioned between the pixel driving circuit layer and the anode layer, wherein a ratio of a thickness of the organic layer to a thickness of the inorganic layer is between 5/2 to 60; and
a light sensing unit, positioned at one side of the display panel and positioned correspondingly to the display transparent region;
wherein the inorganic layer is provided with an opening at a position corresponding to the opening of the second organic sub-layer, and in a direction of the thickness of the display panel, the thickness of the inorganic layer at a position of the opening of the inorganic layer is greater than the thickness of the inorganic layer without the opening.

* * * * *